United States Patent
Safari et al.

[11] Patent Number: 6,049,160
[45] Date of Patent: Apr. 11, 2000

[54] RADIAL CERAMIC PIEZOELECTRIC COMPOSITES

[75] Inventors: Ahmad Safari, Princeton Junction; Stephen C. Danforth, Belle Mead, both of N.J.; Amit Bandyopadhyay, Pullman, Wash.; Thomas McNulty, Edison; Rajesh K. Panda, Piscataway, both of N.J.

[73] Assignee: The State University of New Jersey Rutgers, New Bruswick, N.J.

[21] Appl. No.: 09/114,267

[22] Filed: Jul. 13, 1998

[51] Int. Cl.[7] .................................. H01L 41/08
[52] U.S. Cl. ................. 310/369; 310/311; 310/367; 310/357
[58] Field of Search .................. 310/311, 328, 310/357, 367, 369

[56] References Cited

U.S. PATENT DOCUMENTS

| | | | |
|---|---|---|---|
| 3,215,078 | 11/1965 | Stec | 310/369 |
| 3,820,208 | 6/1974 | Baldy | 310/328 |
| 4,087,715 | 5/1978 | Myer | 310/317 |
| 4,545,625 | 10/1985 | Engwall | 310/369 |
| 4,929,402 | 5/1990 | Hull | 264/22 |
| 4,938,816 | 7/1990 | Beaman et al. | 156/622 |
| 5,121,329 | 6/1992 | Crump | 364/468 |
| 5,506,607 | 4/1996 | Sanders, Jr. et al. | 347/1 |
| 5,697,035 | 12/1997 | Mashtare et al. | 310/328 |
| 5,738,817 | 4/1998 | Danforth et al. | 264/603 |

OTHER PUBLICATIONS

R.E. Newnham et al., Materials in Engineering, vol. 2, Dec. 1980 pp. 93–106.

Glazounov et al, Piezoelectric Actuator Generating Torsional Displacement Applied Physics Letters, vol. 72 No. 20 pp. 2526–2528 Mar, 16 1998.

R. A. Langevin, "The Electro–Acoustic Sensitivity of Cylindrical Ceramic Tubes", Journal of Acoustical Society of America, vol. 26, No. 3 May 1954, p. 421–427.

C.P. Germano, "Supplement to: The Electro–Acoustic Sensitivity of Cylindrical Ceramic Tubes", Journal of Acoustic Society of America, vol. 34 No. 8 p. 1139–1141, Mar. 28, 1962.

Primary Examiner—Thomas M. Dougherty
Attorney, Agent, or Firm—John F. Rittur

[57] ABSTRACT

This invention relates to a new class of piezoelectric composites with a radial design. More particularly, the radial design of these new ceramic/polymer composites show a higher sensitivity in the radial direction than conventional tube structured devices. Devices made utilizing this novel design will therefore show significantly enhanced performance in many applications.

20 Claims, 6 Drawing Sheets

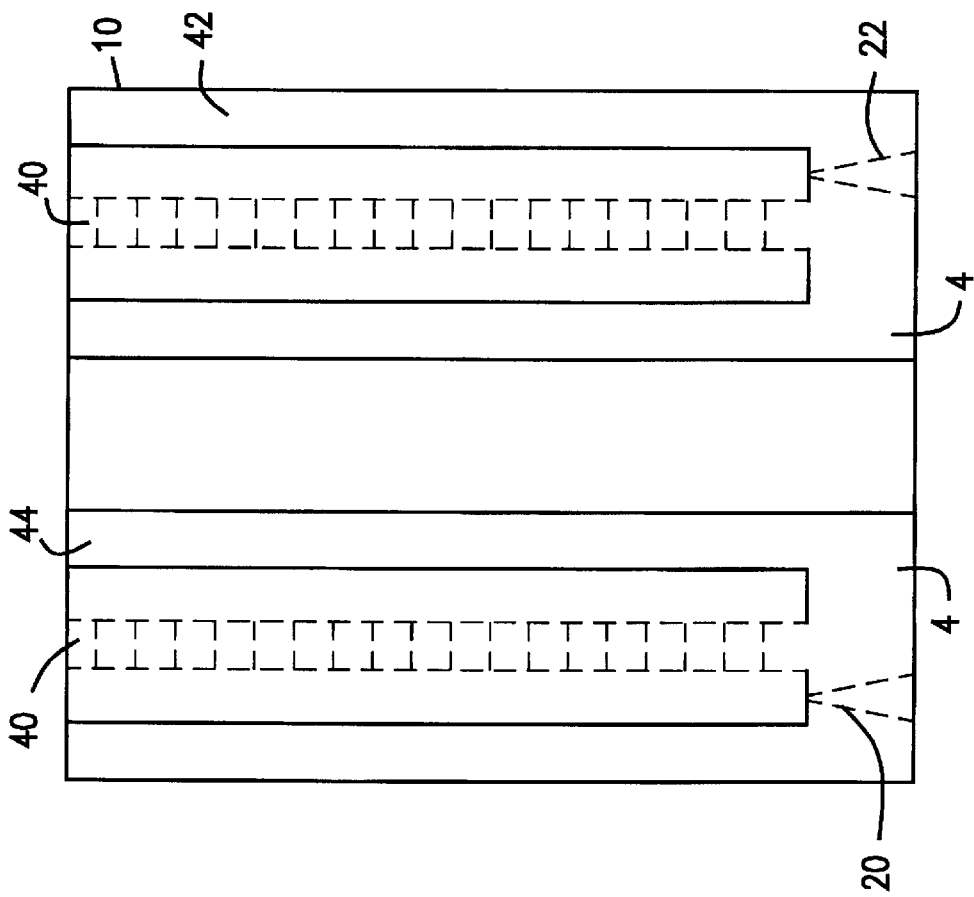
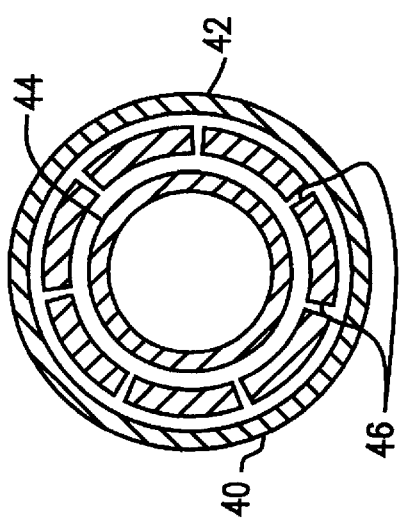
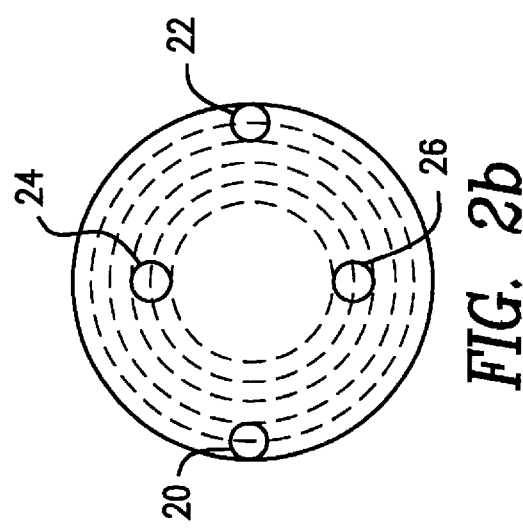
FIG. 2a
FIG. 2b
FIG. 2c

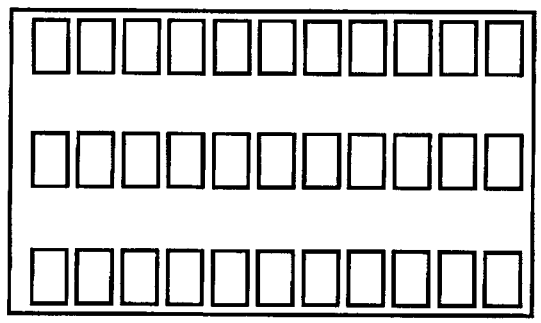
FIG. 4b
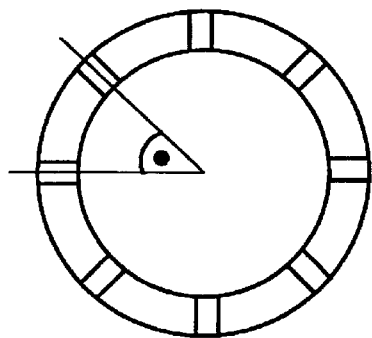
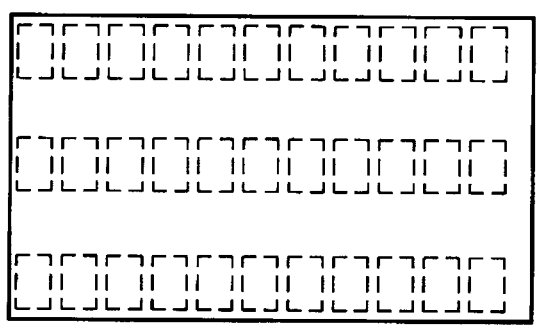
FIG. 4a
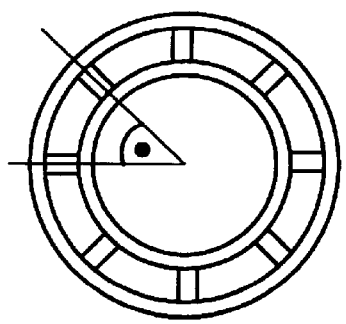

RADIAL CERAMIC PIEZOELECTRIC COMPOSITES

TECHNICAL FIELD

This invention relates to a new class of piezoelectric composites with a radially-oriented design. The radial designs of these new ceramic/polymer composites show a higher sensitivity in the radial direction compared to conventional tube structured transducers. Devices made utilizing this novel design will therefore show significantly enhanced performance in many applications.

BACKGROUND OF THE INVENTION

Composites are often made to create a beneficial mix of the properties of dissimilar materials that are unobtainable in a single homogenous material. In the field of transducers for example, it can be advantageous to use a piezoelectric ceramic-polymer composite, rather than a monolithic tube of piezoelectric material such as lead zirconate titanate (PZT). Piezoelectric composites consist predominantly of a polarizable phase embedded in a non-polarizable material.

These composites have many advantages over traditional monolithic piezoelectric ceramics including: (i) lower densities resulting in acoustic impedance closer to those of the human body, water, etc., thereby eliminating the need for an acoustic matching layer; (ii) low dielectric constants resulting in a high piezoelectric voltage constant g; and (iii) ease of conformability to the shape of the backing material of the composite. Such composite piezoelectric transducers and methods for their production, are described, for example, in Composite Piezoelectric Transducer; R. E. Newnham et al.; *Materials in Engineering*, Vol. 2, December 1980, Pages 93–106, which is incorporated herein by reference.

Four composite designs that have been particularly successful are composites with 2-2, 3-2, 3-1, and 1-3 connectivity, in which piezoelectric ceramic sheets or network or rods are aligned in the poling direction of the composite and embedded in a matrix of a suitable polymer. In the case of the 2-2 composite, both the ceramic and polymer phases are two-dimensionally self-connected throughout the composite. The stiff ceramic phase supports most of the stress applied in the direction of its alignment, yielding a high piezoelectric charge coefficient d, while the composite has a low density and dielectric constant.

In the 3-2 composite, the ceramic phase is continuously self-connected in all three dimensions while the polymer phase is continuous only in two dimensions. The geometry and structure yields a high piezoelectric charge coefficient d and exhibits superior properties over single phase piezoelectric composites.

In the 1-3 composite, the ceramic phase is one-dimensionally self-connected through the composite, while the polymer phase is three-dimensionally self-connected. For some applications, the 1-3 composite yields superior properties to those described above for the 2-2 composite due to the lower density and dielectric constant.

In the 3-1 composite, the ceramic phase is three-dimensionally self-connected through the composite, while the polymer phase is one-dimensionally self-connected. This composite exhibits excellent electromechanical properties, and for some applications this structure may be preferred over the others described above.

Unlike other shaped composites which use the x, y, and z dimensions of the cartesian coordinate system to denote connectivity, cylindrically shaped composites have their connectivity denoted using cylindrical coordinates. Cylindrical coordinates are a generalization of two-dimensional polar coordinates to three-dimensions by superimposing a height and use the z, r, and θ dimensions. The r dimension defines the distance from the origin perpindicular to the z-axis. The θ dimension defines the extent to which an r dimension can be defined while revolving around the z-axis. The z-axis gives the height of the structure and is the same as in cartesian coordinates.

Recently, solid freeform fabrication techniques have been developed for producing three-dimensional articles without the need for molds, dies, or other tooling. One such technique, commercialized by Stratasys™, Inc. of Eden Prarie, Minn., builds solid objects layer by layer from polymer/wax compositions by using computer-aided design (CAD) software programs. According to the technique, which is described in U.S. Pat. No. 5,121,329 and is incorporated herein by reference, a flexible filament of the polymer/wax composition is fed by a pair of counter rotating rollers into a dispensing head which includes a liquifier and nozzle outlet. Inside the liquifier, the filament softens and melts at a temperature just above its melting point.

As the counter-rotating rollers continue to advance the solid filament into the liquifier, the force of the incoming solid filament extrudes the molten material out from the nozzle where it is deposited on a build platform positioned in close proximity to the dispensing head. The CAD software controls the movement of the dispensing head in the horizontal X-Y plane and controls the movement of the build platform in the Z direction. By controlling the processing variables, the extruded bead, called a "road", can be deposited layer by layer in areas defined from the CAD model, leading to the creation of an object that is a three-dimensional depiction of the CAD model.

Although the fused deposition technique is explained in detail above, other techniques, including, but not limited to, stereolithography, selective laser sintering, sanders prototyping, and laminated object manufacturing can be used in this invention. In stereolithography, for example, as described in U.S. Pat. No. 4,929,402, which is herein incorporated by reference, an ultraviolet curable polymer is used as a feed material and a computer controlled and focused beam of ultra violet rays is used to fabricate three dimensional objects.

In selective laser sintering, which is desribed in U.S. Pat. No. 4,938,816 and which is hereby incorporated by reference, a laser curable polymer is used as a feed material and a computer controlled and focused laser beam is used to fabricate three dimensional objects.

In Sanders™ Prototyping technology, which is described in U.S. Pat. No. 5,506,607 and is herein incorporated by reference, an ink jet printing process is used where a thermoplastic polymer is used instead of an ink. Build and support jets deposit thermoplastic polymer compositions based on a toolpath specified by the original CAD file. The build and support polymers are incompatible, allowing for the chemical dissolution of the support without damage to the build material. Three-dimensional objects are built by depositing layer upon layer of the thermoplastic polymers on a computer-controlled fixtureless platform. After the printed layer is complete, the platform indexes by one layer, and a milling bar passes over the layer to remove any excess material. After chemical dissolution of the support, the 3-D prototype made from the build material remains.

In Laminated Object Manufacturing (LOM), sheets of paper, polymer, or ceramic materials are deposited on top of each previous layer and a computer controlled laser beam is used to cut the sheet of material to make the three dimensional object.

In Fused Deposition of Materials which is described in U.S. Pat. No. 5,738,817 and which is hereby incorporated by reference, A 3-D modeling technology is employed to directly deposit green ceramic parts without the need for part-specific dies or tooling. In the case of FDM, a ceramic loaded filament is fed through a heated liquifier, which traverses a 2-D toolpath based on the slice of interest. After deposition is complete, the z-stage indexes by one layer, and the process repeats. After the build process is complete, the part is processed in a fashion similar to an injection-molded part.

This invention takes advantage of the aforementioned solid freeform fabrication technology which makes possible the efficient manufacture of such composites with phase geometries that have previously been impossible and/or impractical. The radial designs disclosed herein show considerably enhanced performance over currently available transducer designs.

SUMMARY OF THE INVENTION

The object of this invention is to provide a new radial design for piezoelectric composites that provides greater sensitivity in the radial direction.

Another object of the invention is to provide for a new transducer design that can be utilized in applications requiring high radial sensitivity.

Yet another object of this invention is to provide for efficiently manufactured electronic ceramic composites with geometeries that have not previously been available.

Another object of the invention is to provide a novel piezoelectric composite design with improved electromechanical properties.

A novel feature of this invention is either the negative or the positive of the structure can be made by using solid freeform fabrication (SFF) or layered manufacturing techniques. Although Fused Deposition Modeling (FDM™) is one of the SFF techniques which is discussed here in detail, the same concept/steps can be used to manufacture composites using other SFF techniques including, but not limited to, those briefly described above.

A desired way to manufacture a composite according to this invention begins with the design of prototypes with different connectivities and controlled volume fractions using computer aided design (CAD) program. Based on the design, the composite can be manufactured in two different ways:

i) in the first method, a polymer mold, the negative of the structure, is designed and fabricated using an SFF technique. The mold is infiltrated with a ceramic or other suitable slurry or suspension, dried or gelled, and cured. The assembly is placed in a furnace or a solvent is used to remove the mold polymer. The part is then subjected to heating schedules sufficient to decompose the binder present in the part and to sinter the structure.

ii) in the second method, the preform can be directly fabricated using a ceramic loaded polymer. The assembly is placed in a furnace to thermally decompose the binder and then sinter the structure.

The process of this invention comprises the following steps: forming a polymer composition into a three-dimensional mold; filling said three-dimensional mold with one or more ceramic compositions, said ceramic composition or compositions having a higher melting point than said polymer composition; hardening said ceramic composition or compositions; removing at least a portion of said three-dimensional mold; and filling the voids caused by the removal of said three-dimensional mold with a material which has a piezoelectric coefficient which is substantially different from the piezoelectric coefficient of said ceramic composition or compositions.

More specifically, the piezoelectric composite comprises: at least one piezoelectric phase and least one non-piezoelectric phase formed in a tubular structure having an inside diameter and an outside diameter, wherein said piezoelectric phase is oriented radially within said tubular structure and poled in the radial direction, and wherein said non-piezoelectric phase is located between said inner diameter and outer diameter of said tubular structure.

BRIEF DESCRIPTION OF THE DRAWINGS

FIGS. 1*a*, 1*b*, 2*a*–2*c* and 3 show manufacturing steps and embodiments of the present invention.

FIGS. 4*a*–4*d*, 5*a* and 5*b* show embodiments of the present invention.

DETAILED DESCRIPTION OF THE INVENTION

Figure 3:
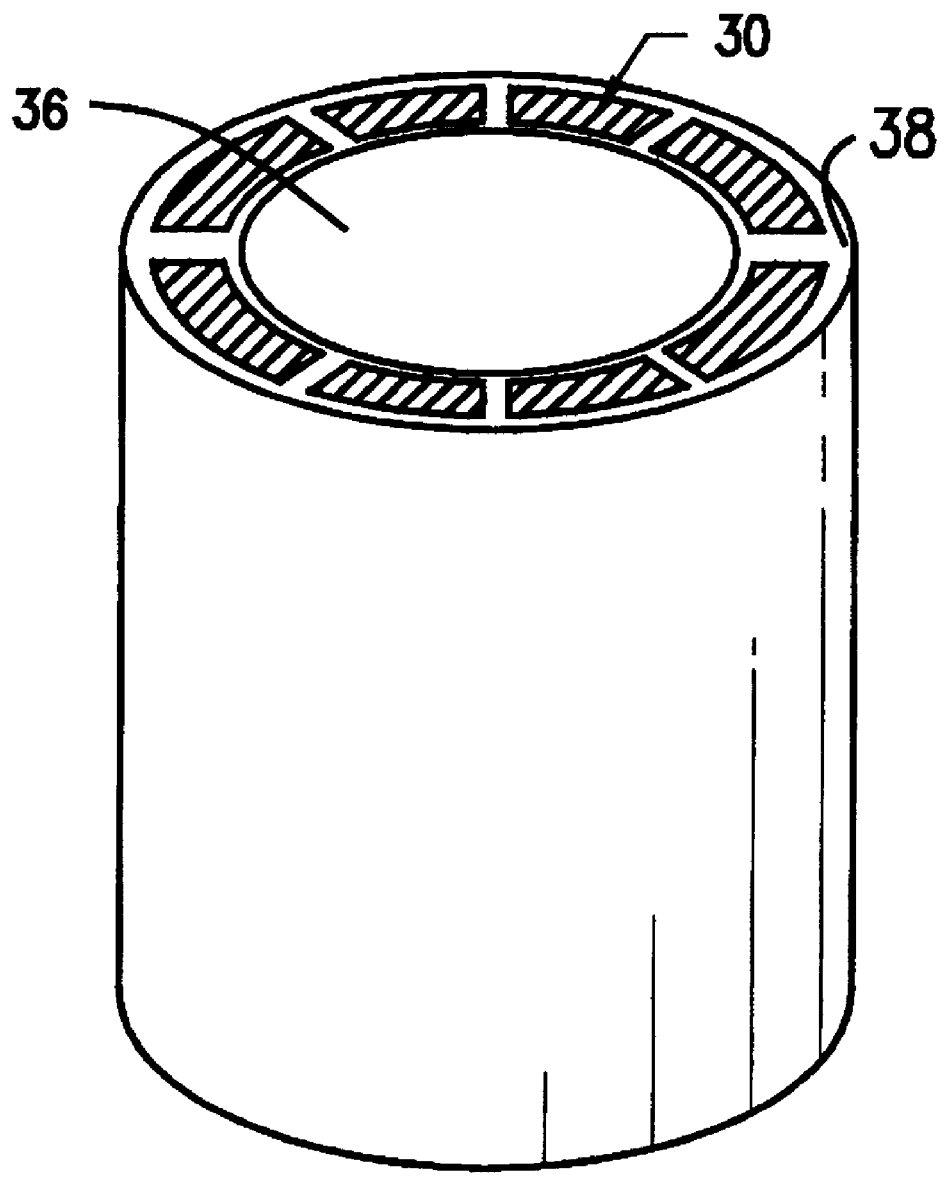
Figure 4D:
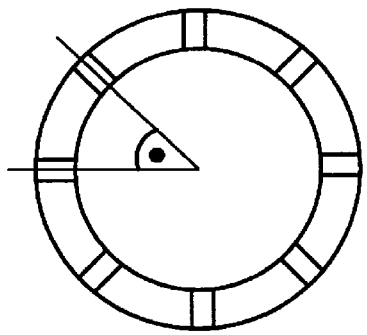
Figure 4D:
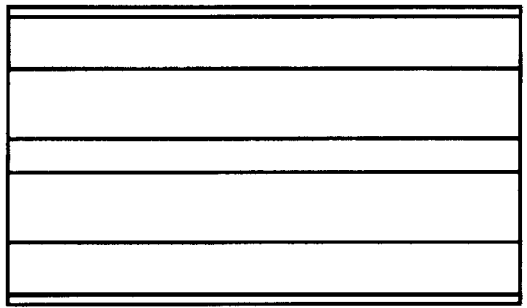
Figure 4C:
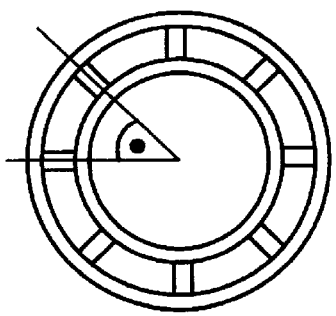
Figure 4C:
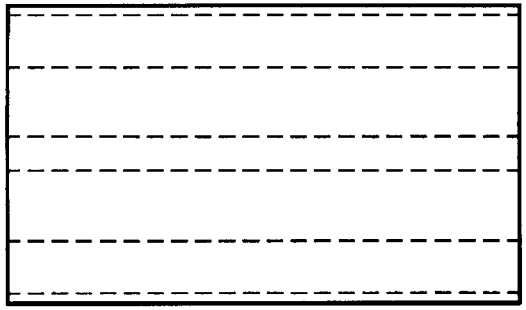

FIGS. 1, 2, and 3 show the steps for the indirect method of manufacturing a composite constructed in accordance with the principles of the present invention.

Figure 1B:
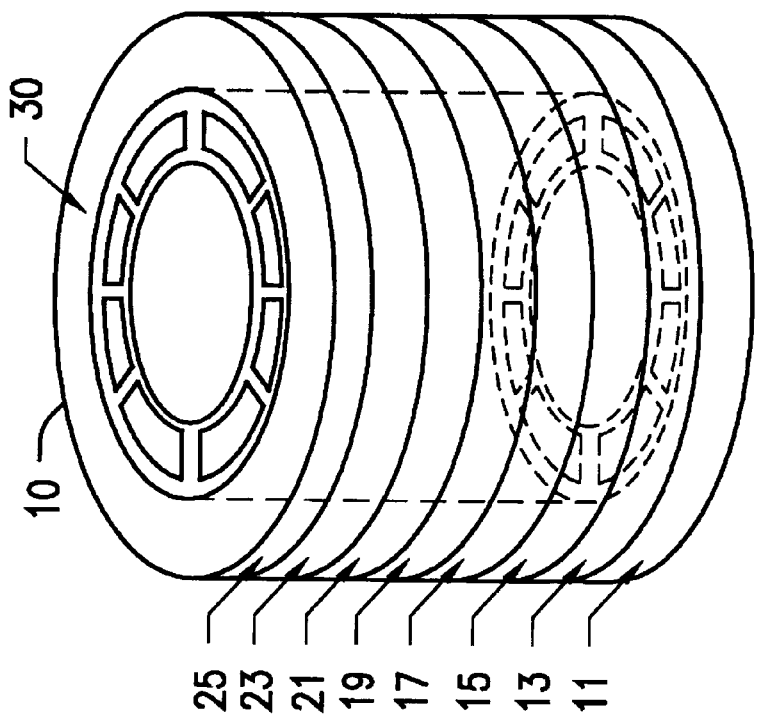
Figure 1A:
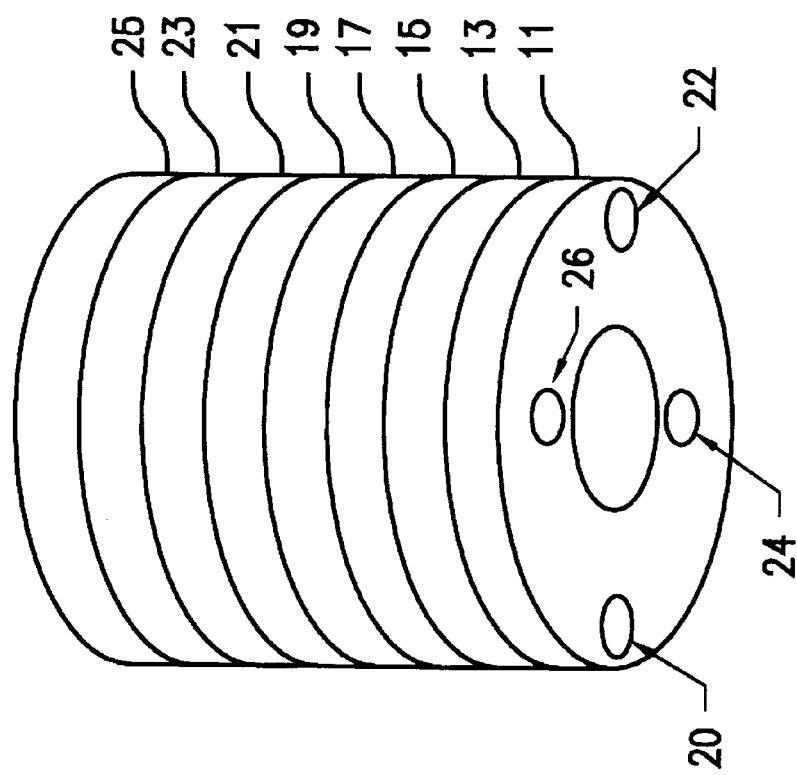

FIGS. 1*a* and 1*b* are a top and bottom view of a mold 10 which is formed by building individual layers 11, 13, 15, 17, 19, 21, 23, and 25 on top of each other. The layers of material usually consist, for instance, of a multicomponent waxed based thermoplastic polymer, such as investment casting wax containing polymer, elastomer, wax and a tackifier. Also, it could be a combination of other thermoplastic polymers, or ultra violet ray or laser curable polymers. Each layer 11, 13, 15, 17, 19, 21, 23, and 25 is formed by using a solid freeform fabrication (SFF) or layered manufacturing techniques, such as Fused Deposition Modeling (FDM™) or Sanders™ Prototyping, though the same concept/steps can be followed using other SFF techniques.

In the case of using the FDM™ technique to form the mold 10 of FIG. 1*a*, liquid polymer beads are deposited and solidified continuously, creating a polymer road. When several roads are build next to each other, a layer with its own pattern, based on the mold design, is created. The solid areas of the layers of the mold 10 are created by depositing and curing or solidifying the liquid polymers. The holes are created by not depositing or solidifying the polymer in that area. Alternatively, in the case of Sanders Prototyping, there are two jets: one for a first polymer that will form the mold itself and one for the removable (i.e. chemically soluble) polymer that will fill the areas that will later become the voids or holes in the mold structure.

The number of layers, of which only eight are shown for simplification, and the pattern of each layer, of which the 3-1 wagon wheel structure is shown for simplification, are chosen to be identical to the architecture of the final transducer. The mold size is slightly larger than the desired size of the final transducer to allow for shrinkage of the structure during drying and firing. Additionally, it should be noted that the connectivity is based on cylindrical coordinates, as described above.

The holes 20, 22, 24, and 26 in mold 10 are filled with a slurry or gelling solution by pouring, injection, or immersion of the structure. To ensure complete infiltration of the mold 10, excess slurry may be allowed to flow out of the top of mold 10 through the orafice 30, which, in this case, has the wagon wheel shape in FIG. 1b. By having the orafice 30 in the top of the mold 10, entrapped air is easily removed during the casting process.

FIGS. 2a, 2b, and 2c show the top, bottom and side views respectively of a tube composite mold for a composite with a wagon wheel shape made by this process where the holes 20 and 22 in mold 10 are conically shaped. The mold design shown consists of an inner mold wall 44 and an outer mold wall 42. Additionally, in the mold for the wagon wheel shaped composite shown, there are structures 40 spaced around the diameter of the mold in between inner mold wall 44 and outer mold wall 42. These structures 40 will later become voids between the wheel spokes in this design. Moreover, the inner mold wall 44, outer mold wall 42 and structures 40 are held fixed by a base 4 which is continuous around the diameter of the tubular mold. The void in the mold is in the shape of the desired final composite, in this case the wagon wheel design wherein the spokes are continuous in the r dimension.

The mold contains four slurry injection ports 20, 22, 24, and 26 positioned within the base 4. For this composite design, two ports 20 and 22 are positioned between the outer mold wall 42 and the outer wall of the structures 40 and two others 24 and 26 (which are not shown in FIG. 2c) are positioned between the inner mold wall 44 and the inner wall of the structures 40. The use of multiple injection ports allows for the infilitration of 55 vol. % ceramic slurry used to create the radial composites of this invention.

The slurry or gelling solution could be varied based on the requirements of the final composite and/or manufacturing considerations and may consist of, for instance, lead zirconate titanate [$Pb(ZrTi)O_3$], lead metaniobate [$Pb(Nb_2O_6)$], modified $PbTiO_3$ including [$(Pb,Ca)TiO_3$] and [$(Pb,Sm)TiO_3$], barium titanate [$BaTiO_3$], PMN-PT [$(1-x)Pb(Mg_{1/3}Nb_{2/3})O_3$-$xPbTiO_3$], PZN-PT/BT [$Pb(Zn_{1/3}Nb_{2/3})O_3$ $BaTiO_3$-$PbTiO_3$], PNN-PZ-PT, or another suitable electronic ceramic material.

The slurry or gel would contain, in addition to the above mentioned ceramics in particulate form, appropriate binders, dispersants, etc. to minimize the formation of agglomerates and to minimize the slurry viscosity to allow water infiltration into the mold. Such binders and dispersants may contain for example, low molecular weight organic alchohols for anti-foaming agents, acrylic binders, polymeric binders, and the like.

The structure is then dried, gelled, or cured in air or in some other environment. Either a solvent or a thermal cycle is used to remove the mold 10 and any organic components in the slurry or gelling solution prior to sintering. The thermal cycle is performed in a furnace in air, or in an inert gas environment such as nitrogen or argon, or in vacuum. Moreover, excess slurry or gelling solution may form small nodules in the position where the injection ports exist, which have not been shown in the figures, on the component that will later have to be removed by grinding or other appropriate means.

FIG. 3 illustrates the results of the thermal cycle for this particular 3-1 wagon wheel design. Since the top and bottom views of this particular design are identical, only one view is shown. The piezoelectric phase 38 is in the wagon wheel shape and has a non-piezoelectric phase 30 between the spokes. At the center of the composite is a void 36 containing no filler material. The 3-1 design depicted in FIG. 3 could also be made using a direct method like, for example, Fused Deposition of Ceramics (FDC).

The structure may then be sintered in a furnace using a conventional sintering cycle which is based, in part, on the piezoelectric material. After sintering, the voids between the inner and outer walls of the structure are filled with a non-polarizable filler material by pouring, injection or by immersion of the structure. Preferably, the void 36 in the center of the structure is not filled with filler material.

The filler may consist either of a non-polarizable material such as self-hardening plastic, for example epoxy or silicone rubber or a polarizable material such as Poly(vinylidene flouride) and copolymers thereof, polyvinylchloride, polyvinylflouride, or other polymer having suitable piezoelectric properties. Moreover, the filler may also be paper, glass, ceramic or other suitable non-polarizable material.

At this point, the formation of a radial design with 3-1 connectivity is completed. That is, piezoelectric phase are continuously self-connected in three-dimensions and the filler is continuously self-connected in one-dimension.

The composite is then electroded with silver paint, and poled radially (i.e. the polarization field is established between the inner and outer surfaces of the tubular composite) under an electric field. At this point, the formation of composite with 3-1 connectivity from a polymeric mold manufactured via solid freeform fabrication is complete.

FIG. 4 shows further embodiments of the present invention. FIGS. 4a through 4d show top and side views of radial composites with 3-2, 3-1, 1-3, and 2-2 connectivity. FIG. 4a shows the top and side view of a 3-2 composite with the radial design. FIG. 4b shows the top and side view of a 1-3 composite with the radial design. FIG. 4c shows the top and side view of a 3-1 composite with the radial design. FIG. 4d shows the top and side view of a 2-2 composite with the radial design. Certain designs with enclosed void patterns can only be created using a deposition technique that allows for the deposition of multiple materials like, for example Sanders Prototyping™ and Fused Deposition Modeling (FDM).

Figure 5A:
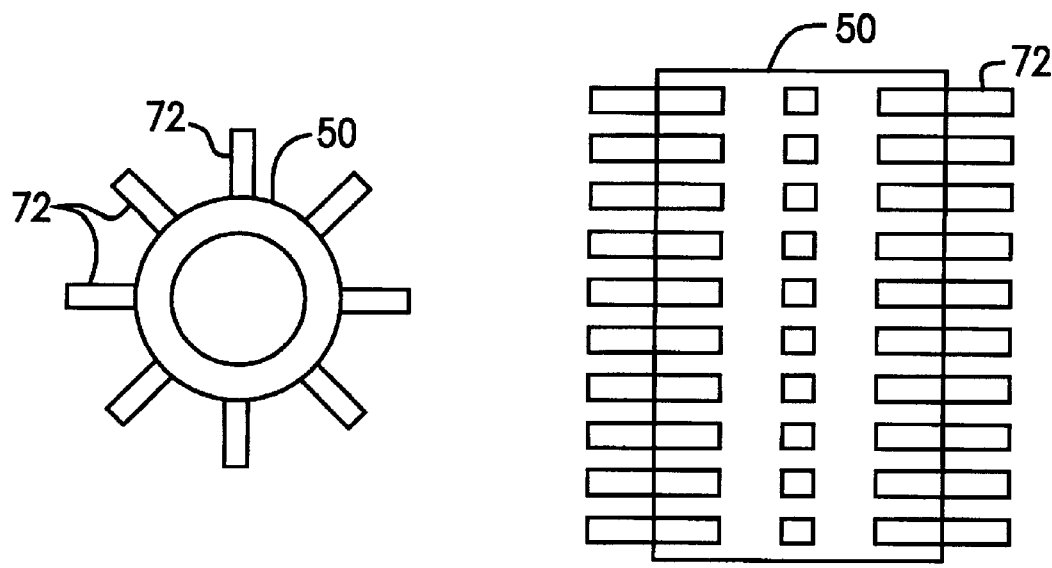
Figure 5B:
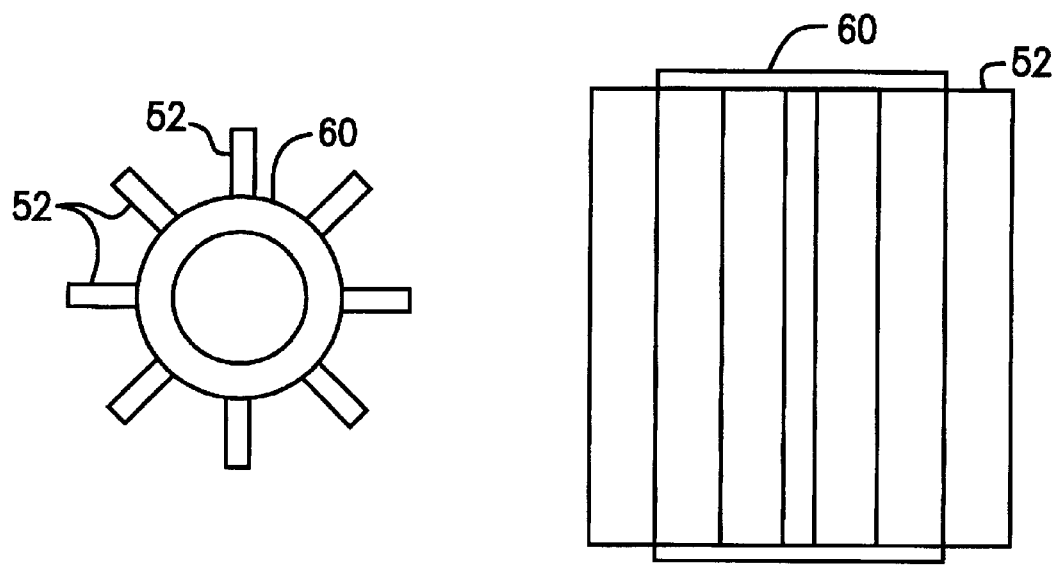

FIGS. 5a and 5b show two additional types of radial composite designs. FIG. 5a shows a 1-3 radial composite design having a tubular base 50 from which a plurality of blades 72 project radially. FIG. 5b shows a 2-2 radial composite design having a tubular base 60 and a series of blades 52 projecting radially therefrom.

The described invention allows for an unlimited number of polarizable phases in one composite structure. Although not illustrated, a further embodiment of the present invention is a composite material where both the number of polarizable materials and the polarizable phase volume content across the device is varied. Moreover, although also not illustrated, a further embodiment of the present invention is a composite material having one or more combinations of 1-3, 2-2, 3-1, 3-2, 2-3 and 3-3 connectivities in a single composite.

The following examples will further illustrate the present invention.

EXAMPLE 1

The 3-2 tube composite prototype is designed using a CAD-based software package (e.g. Pro-Engineer, AutoCAD, etc.), and saved as a .stl file. The .stl file is then imported to a Sanders Prototyping Model MM-6PRO, which converts the file to a machine-readable file, called a .bld file.

The MM-6PRO builds the mold based on the prototype specifications. The Sanders prototyping machine employs 2 jets. One jet is used to deposit the material which form the shape of the desired prototype, the other jet deposits material which will make up the mold. The 2 thermoplastic materials are insoluble in each other. In this case, the prototype fill serves as support for the various overhangs present in the 3-2 tube composite mold. The prototype is then dissolved using petroleum-based solvent (held at 60° C. for 1 hour under ultrasonic vibration) which leaves the mold intact after dissolution.

After molds have been produced using the Sanders Prototyping MM-6 PRO, molds are infiltrated with a 55 vol. % PZT-5H aqueous-based slurry. The slurry is injected through the 4 injection ports, situated on the bottom of the mold. The mold is then de-aired at 30 in-Hg for 1 minute to remove any entrapped air within the mold cavity. The mold is then re-filled with slurry until material extrudes from the upper exposed surface of the mold. The parts are allowed to dry overnight at room temperature, then de-waxed and binder burn-out using a ramp of 0.5° C./min to 200° C., with a 1 hour soak, followed by a ramp of 1.5° C./min to 700° C., with a 1 hour soak at 700° C. After de-waxing is complete, the parts are sealed in an alumina crucible with 1.0 grams of excess lead source, and sintered at 1285° C. for 1 hour. After sintering, the parts are embedded in Spurr epoxy, and de-aired at 30 in-Hg for 30 minutes. The epoxy is then cured at 60° C. for 24 hours. After curing, the excess epoxy is removed from the inner portion of the tube using an 8 mm drill bit mounted on a drill press. After the inner epoxy is removed, the outer epoxy is polished off using 240 grit paper mounted on a rotary grinding wheel. The resultant tube is then mounted on an 8 mm mandrel. The composite is sandwiched by 2 collars, each 12 mm in outer diameter. The composite is then polished further to ensure the outer diameter is set at 12 mm. After polishing is complete, the composite is electroded on the outer and inner portion, mounted onto a grounded rotating mandrel, and poled radially using a 30 kV corona plume positioned approximately 4.5 cm from the composite surface. The composite is rotated throughout the poling process at a speed of 10 rpm. After poling, the part is allowed to age 24 hours before electromechanical evaluation.

EXAMPLE 2

Before any prototypes can be made, ceramic-loaded Fused Deposition of Ceramics (FDC) filament must be prepared. First, as-received PZT-5H powder is coated with stearic acid by mixing 300 g of powder with 300 ml of a 3 wt. % solution of stearic acid in toluene. After mixing for 4 hours, the solution is filtered off, and the powder is allowed to dry overnight. The coated powder is then mortared to break up any soft agglomerates which may have formed during drying.

The polymer phase in the FDC filament is a quaternary mixture of a binder, tackifier, wax, and plasticizer. The binder is Vestoplast 703, supplied by Huls America Inc. The tackifier is Escorez 1304, supplied by Exxon Chemical Company. The wax is Vestowax A-616, supplied by Huls America Inc. Finally, the plasticizer is Indopol H-1500, supplied by Amoco Chemical Company. In this formulation, 100 parts (by weight) binder is mixed with 20 parts tackifier, 15 parts wax, and 5 parts plasticizer. The contents are mixed at 175° C. for approximately 3 minutes using a high shear mixer. The formulation is then de-aired at 30 in. Hg for 30 minutes at 175° C. to remove any entrapped air. The binder formulation is then cast in aluminum dishes and allowed to cool overnight.

To create the compounded mixture of PZT with the binder formulation, 267.12 g of coated PZT powder is mixed with 15.27 g of binder formulation using a Haake System 9000 torque rheometer. Mixing is performed at 100 rpm and a temperature range of 140–160° C. This mixture corresponds to 60 vol. % PZT and 40 vol. % polymer/surfactant.

Once mixed, the compound is used to create FDC filament. Filament is extruded using a 70 mil orifice attached to an Instron machine with a capillary rheometer attachment. A rate of 1.0 mm/min at a temperature range of 95 to 110° C. is used to extrude filaments approximately 18 inches in length.

The 3-1 tube composite prototype is designed using a CAD-based software package (e.g. Pro-Engineer, AutoCAD, etc.), and saved as a .stl file. The .stl file is then imported to a modified Stratasys 3D-Modeler, which converts the .stl file to a machine-readable .sml file. The filaments discussed earlier are fed into the 3D-Modeler, which creates a direct 3D prototype based on CAD specifications. Once completed, the part is removed from the machine, and the organics are removed using a heating schedule of 0.5° C./minute to 550° C., with a 4 hour dwell at 550° C. The parts are then sintered in a sealed crucible with 1 g of excess Pb source using a ramp of 3.5° C./minute to 1285° C., with a 1 hour soak at 1285° C.

After sintering, the parts are embedded in Spurr epoxy, and de-aired at 30 in-Hg for 30 minutes. The epoxy is then cured at 60° C. for 24 hours. After curing, the excess epoxy is removed for the inner portion of the tube using an 8 mm drill bit mounted on a drill press. After the inner epoxy is removed, the outer epoxy is polished off using 240 grit paper mounted on a rotary grinding wheel. The resultant tube is then mounted on an 8 mm mandrel. The composite is sandwiched by 2 collars, each 12 mm in outer diameter. The composite is then polished further to ensure the outer diameter is set at 12 mm. After polishing is complete, the composite is electroded on the outer and inner portion, mounted on a grounded rotating mandrel, and poled radially using a 30 kV corona plume positioned approximately 4.5 cm from the composite surface. The composite is rotated throughout the poling process at a speed of 10 rpm. After poling, the part is allowed to age 24 hours before electromechanical evaluation.

The invention described herein has been disclosed in terms of specific embodiments and applications. However, these details are not meant to be limiting and other embodiments, in light of this teaching, would be obvious to persons skilled in the art. Accordingly, it is to be understood that the drawings and descriptions are illustrative of the principles of the invention, and should not be construed to limit the scope thereof.

We claim:

1. A piezoelectric composite comprising:
   at least one piezoelectric phase and least one non-piezoelectric phase formed in a tubular structure having an inside diameter and an outside diameter, wherein said piezoelectric phase is oriented radially within said tubular structure and poled in the radial direction, and wherein said non-piezoelectric phase is located between said inner diameter and outer diameter of said tubular structure, wherein at least one piezoelectric phase is continuously self-connected in three dimensions.

2. A piezoelectric composite of claim 1 wherein at least one non-piezoelectric phase is continuously self-connected only in one dimension.

3. A piezoelectric composite comprising:

at least one piezoelectric phase and least one non-piezoelectric phase formed in a tubular structure having an inside diameter and an outside diameter, wherein said piezoelectric phase is oriented radially within said tubular structure and poled in the radial direction, and wherein said non-piezoelectric phase is located between said inner diameter and outer diameter of said tubular structure, wherein at least one non-piezoelectric phase is continuously self-connected in three dimensions.

4. A piezoelectric composite of claim 3 wherein at least one piezoelectric phase is continuously self-connected only in one dimension.

5. A piezoelectric composite comprising:

at least one piezoelectric phase and least one non-piezoelectric phase formed in a tubular structure having an inside diameter and an outside diameter, wherein said piezoelectric phase is oriented radially within said tubular structure and poled in the radial direction, and wherein said non-piezoelectric phase is located between said inner diameter and outer diameter of said tubular structure, wherein at least one piezoelectric phase is continuously self-connected only in two dimensions.

6. A piezoelectric composite of claim 5 wherein at least one non-piezoelectric phase is continuously self-connected only in two dimensions.

7. A piezoelectric composite comprising:

at least one piezoelectric phase and least one non-piezoelectric phase formed in a tubular structure having an inside diameter and an outside diameter, wherein said piezoelectric phase is oriented radially within said tubular structure and poled in the radial direction, and wherein said non-piezoelectric phase is located between said inner diameter and outer diameter of said tubular structure, wherein at least one non-piezoelectric phase is continuously self-connected only in two dimensions.

8. A piezoelectric composite having at least one piezoelectric phase and at least one non-piezoelectric phase comprising:

a tubular structure portion having an inside diameter and an outside diameter, and a plurality of blade structures projecting radially from said outer diameter of said tubular structure, wherein said piezoelectric phase is poled in the radial direction.

9. The piezoelectric composite of claim 8 wherein the piezoelectric phase(s) is selected from the group consisting of $Pb(Zr,Ti)O_3$, $BaTiO_3$, $PbZrO_3$, $PbTiO_3$, $PbNb_2O_6$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3$-$xPbTiO_3$, $(1-x-y)\ Pb(Zn_{1/3}Nb_{2/3})O_3$-$xPbTiO_3$-$yBaTiO_3$, and $(1-x-y)Pb(Zn_{1/3}Nb_{2/3})O_3$-$xBaTiO_3$-$yPbTiO_3$, $xPZN$-$(1-x)PMN$, $xPMN$-$(1-x)PZT$, $xPZN$-$(1-x)PZT$, PNN-PZ-PT.

10. The piezoelectric composite of claim 8 wherein the non-piezoelectric phase(s) is selected from the group consisting of polymer, epoxy, silicone rubber, polyvinylchloride, glass, or ceramic.

11. A piezoelectric composite of claim 8 having more than one piezoelectric phase.

12. A piezoelectric composite of claim 8 having more than one non-piezoelectric phase.

13. A piezoelectric composite of claim 8 having more than one piezoelectric phase and more than one non-piezoelectric phase.

14. A piezoelectric composite of claim 8 wherein at least one piezoelectric phase is continuously self-connected in three dimensions.

15. A piezoelectric composite of claim 14 wherein at least one non-piezoelectric phase is continuously self-connected only in one dimension.

16. A piezoelectric composite of claim 8 wherein at least one non-piezoelectric phase is continuously self-connected in three dimensions.

17. A piezoelectric composite of claim 16 wherein at least one piezoelectric phase is continuously self-connected only in one dimension.

18. A piezoelectric composite of claim 8 wherein at least one piezoelectric phase is continuously self-connected only in two dimensions.

19. A piezoelectric composite of claim 18 wherein at least one non-piezoelectric phase is continuously self-connected only in two dimensions.

20. A piezoelectric composite of claim 8 wherein at least one non-piezoelectric phase is continuously self-connected only in two dimensions.

* * * * *